United States Patent
Samad et al.

(10) Patent No.: US 7,236,026 B1
(45) Date of Patent: Jun. 26, 2007

(54) CIRCUIT FOR AND METHOD OF GENERATING A FREQUENCY ALIGNED CLOCK SIGNAL

(75) Inventors: Maheen A. Samad, Mountain View, CA (US); Alireza S. Kaviani, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 38 days.

(21) Appl. No.: 11/169,461

(22) Filed: Jun. 29, 2005

(51) Int. Cl.
*H03L 7/06* (2006.01)

(52) U.S. Cl. ..................... 327/156; 327/147
(58) Field of Classification Search ........ 327/147–148, 327/150–151, 154–157, 159–163; 331/17, 331/25, DIG. 2; 375/373–376
See application file for complete search history.

(56) References Cited

U.S. PATENT DOCUMENTS

| | | | |
|---|---|---|---|
| 5,486,866 A * | 1/1996 | Helfrich et al. | 348/500 |
| 6,384,647 B1 | 5/2002 | Logue | 327/153 |
| 6,756,822 B1 | 6/2004 | Kaviani | 327/3 |
| 6,847,240 B1 | 1/2005 | Zhou | 327/143 |
| 7,005,928 B2 * | 2/2006 | Albasini et al. | 331/16 |
| 7,071,751 B1 | 7/2006 | Kaviani | 327/143 |
| 2005/0036580 A1 * | 2/2005 | Rana | 375/376 |

OTHER PUBLICATIONS

Xilinx, Inc.; "Dual-Edge Synchronized Data Sampler", U.S. Appl. No. 11/015,322, filed Dec. 17, 2004, by Kaviani et al.
Xilinx, Inc.; "Data Generator", U.S. Appl. No. 11/061,795, filed Feb. 18, 2005, by Jennifer Lilley.
Xilinx, Inc.; "Circuit for Digital Frequency Synthesis in an Integrated Circuit", U.S. Appl. No. 11/169,818, filed Jun. 29, 2005, by Kaviani et al.
Xilinx, Inc.; "A Circuit for and Method of Changing a Frequency in a Circuit", U.S. Appl. No. 11/170,020, filed Jun. 29, 2005 by Maheen A. Samad.

* cited by examiner

*Primary Examiner*—Linh My Nguyen
(74) *Attorney, Agent, or Firm*—John J. King

(57) ABSTRACT

A circuit for generating a clock signal which is frequency aligned with a reference clock signal is disclosed. The circuit comprises a phase detector coupled to receive the reference clock signal and the generated clock signal. A frequency alignment circuit generates an average frequency alignment signal based upon comparison of the phase of a generated pulse train and the phase of a reference pulse train. Finally, an oscillator control circuit is selectively coupled to receive an output of the phase detector based upon the frequency alignment signal from the frequency alignment circuit. The oscillator control circuit generating an oscillator control signal for controlling the frequency of the generated clock signal. A method of generating a clock signal which is frequency aligned with a reference clock signal is also disclosed.

18 Claims, 5 Drawing Sheets

CIRCUIT FOR AND METHOD OF GENERATING A FREQUENCY ALIGNED CLOCK SIGNAL

FIELD OF THE INVENTION

This invention relates generally to integrated circuits, and in particular, to a circuit for and method of generating a frequency aligned clock signal.

BACKGROUND OF THE INVENTION

Internal clocks are an integral part of any integrated circuit, and must be carefully controlled to ensure proper timing in the integrated circuit. Clock management circuits are used in an integrated circuit, such as a programmable logic device (PLD), to control timing of various clock signals of the device. Certain aspects of clock management circuits are often performed using phase-lock loop (PLL) circuits. In general, a PLL is used to synchronize the frequency and/or phase of an output clock signal to that of an input clock signal. In addition to their primary function of removing clock distribution delay, PLLs typically provide additional functionality such as frequency synthesis and phase shifting.

As shown in FIG. 1, a PLL 100 uses a voltage controlled oscillator 102, which generates a clock signal that approximates the input clock REFCLK. Control logic 104, consisting of a phase detector 106 and a filter 108, adjusts the oscillator frequency and/or phase to compensate for the clock distribution delay. The phase detector determines how much and in what direction the frequency and/or phase of the output clock signal should be adjusted relative to the input clock signal. The control logic 104 compares the input clock REFCLK to the feedback clock OSCCLK, and adjusts the oscillator clock until the rising edge of the input clock REFCLK aligns with the OSCCLK. Because a PLL generates its own clock signal by using an oscillator whose frequency of oscillation is adjusted to match a given input clock, a PLL may reduce the reference clock jitter.

A PLL could use either analog or digital circuitry. Each approach has its own advantages. An analog implementation generally produces a PLL with a finer timing resolution, and sometimes consumes less silicon area. Conventional circuits using analog controlled PLLs maintain phase alignment through feedback loops with continuous gain from the phase error signal to control the oscillator. However, analog implementations can require additional power supplies which require close control. These analog implementations also typically necessitate large loop filter elements to give low loop bandwidths needed for jitter filtering applications. A large magnitude of jitter can cause the PLL's phase detector to fail and the system to lose lock.

Conversely, digital implementations offer advantages in noise immunity, lower power consumption and better jitter performance. Digital implementations also provide the ability to stop the clock, facilitating power management. Some conventional devices use digitally controlled loops with digitally quantized gain from the phase/frequency error signal to control the oscillator. However, these structures also typically have complex digital loop filters that require significant area.

Accordingly, there is a need for a more efficient circuit for and method of generating a clock signal.

SUMMARY OF THE INVENTION

In one embodiment of the present invention a circuit for generating a clock signal which is frequency aligned with a reference clock signal is disclosed. The circuit comprises a phase detector coupled to receive the reference clock signal and the generated clock signal. A frequency alignment circuit is coupled to receive a reference pulse train based upon the reference clock signal and a generated pulse train based upon the generated clock signal. The frequency alignment circuit generates an average frequency alignment signal based upon a comparison of the phase of the generated pulse train and the phase of the reference pulse train. In one aspect of the invention the frequency alignment circuit includes a finite state machine. Finally, an oscillator control circuit is selectively coupled to receive an output of the phase detector based upon the average frequency alignment signal. The oscillator control circuit generates an oscillator control signal for controlling the frequency of the generated clock signal.

In another embodiment of the present invention a method of generating a clock signal which is frequency aligned with a reference clock signal is also disclosed. The method comprises steps of receiving the reference clock signal and the generated clock signal at a phase detector; comparing the reference clock signal and the generated clock signal; adjusting the frequency of the generated clock signal to maintain the frequency of the generated clock signal with the frequency of the reference clock signal; determining when the phase difference between the generated clock signal and the reference clock signal has exceeded a predetermined value; and aligning an average frequency signal of the generated clock to a frequency signal of the reference clock.

DETAILED DESCRIPTION OF THE DRAWINGS

The circuits and methods for generating a clock signal enable low-jitter frequency clock synthesis using a low area structure by maintaining average frequency alignment. The circuits and methods maintain an output frequency signal which is a multiple of an input frequency signal. A binary phase detector error signal is used in conjunction with a periodic pulse train to ensure the generated clock frequency does not drift over a long time. A novel state machine maintains average frequency alignment without requiring the typical loop gain necessary in conventional frequency aligning systems. As will be described in more detail, a stable long-term frequency is maintained by monitoring and controlling possible short-term instability within tolerable bounds.

Figure 1:
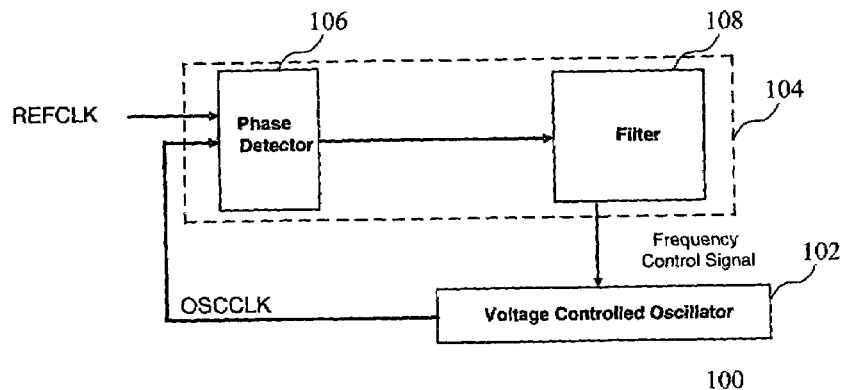
FIG. 1 is block diagram of a conventional phase-locked loop circuit.
Figure 2:
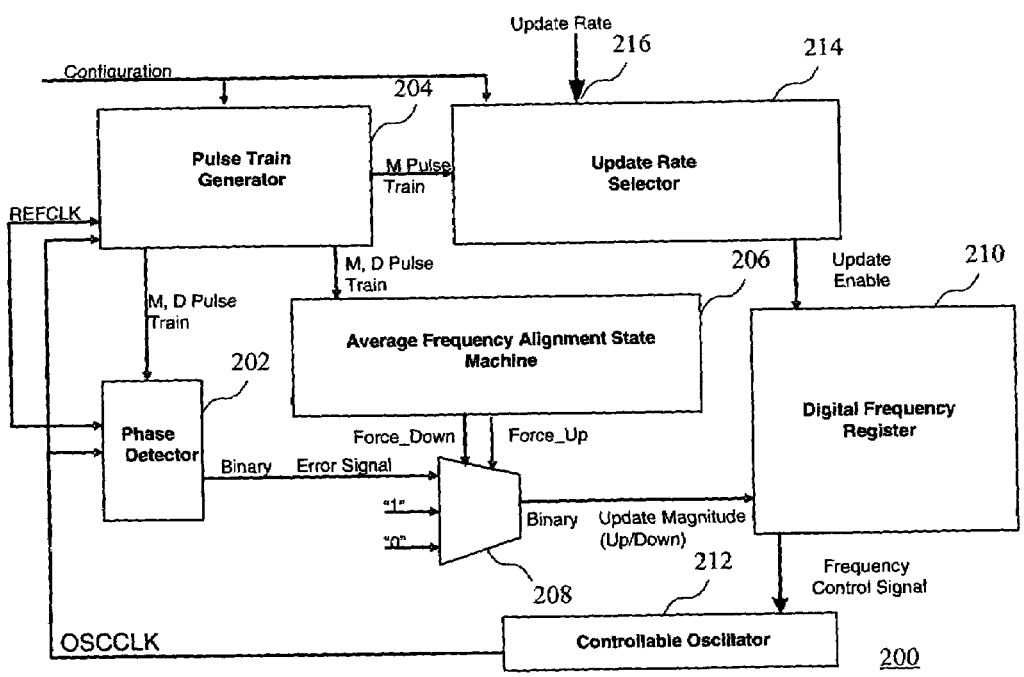
FIG. 2 is a circuit for generating an oscillator clock signal according to an embodiment of the present invention.
Figure 3:
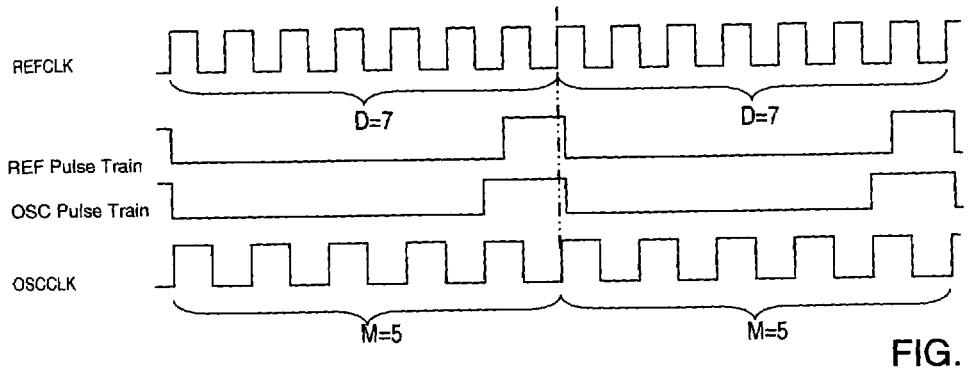
FIG. 3 is a timing diagram showing clock signals used in the circuit of FIG. 2.

Turning first to FIG. 2, a circuit 200 for generating a clock signal according to an embodiment of the present invention is shown. The circuit comprises a phase detector 202 coupled to receive an input clock (REFCLK), and a generated clock (OSCCLK), and output a binary error signal. A pulse train generator 204 is coupled to receive both the input clock REFCLK and the output clock OSCCLK. The pulse train generator outputs M and D pulse trains, as shown in FIG. 3, and provides a configurable multiplying factor (M/D). The M and D pulse trains are coupled to an average frequency alignment state machine 206, which outputs an average frequency alignment signal (e.g. a Force_Up or Force_Down signals), as will be described in more detail in reference to FIG. 8. That is, the average frequency alignment state machine 206 controls a selection circuit 208, which could comprise a multiplexer, for example. The selection circuit 208 selects one of a binary error signal output from the phase detector 202, or a fixed frequency increase or decrease signal based upon the average frequency alignment signal from the average frequency alignment state machine (i.e. a high signal, e.g., "1", is output from the selector circuit if a Force_Up signal is high, or a low signal, e.g., "0", is output if a Force_Down is high, or the output of the phase detector 202, i.e., the binary error signal, is output if both Force_Up and Force_Down are low). As will be described in more detail below, the average frequency alignment signal enables the output clock to follow the average frequency of the input clock signal by aligning the generated clock signal to the input clock signal or a signal shifted by a specified multiple of the input clock with the desired low jitter characteristics. A frequency update signal, which could be a binary update magnitude signal for example, output from the selection circuit 208 is coupled to a digital frequency register 210, which will be described in more detail in reference to FIG. 5.

The circuit of FIG. 2 also enables a variable update rate which is programmable to set the input jitter filtering characteristics. That is, an update rate selector 214 receives the M pulse train from the pulse train generator 204, and outputs an update enable signal which is coupled to the digital frequency register 210. The update rate selector 214 also receives an update rate signal at an input 216. The update rate signal could be, for example, a count value provided by a user to the update rate selector functioning as a counter. The update rate signal enables controlling the input/output jitter characteristics. That is, the update rate selector controls how tightly the output signal follows the input signal. When there is high input jitter, a lower update rate prevents the output from following the input jitter and provides a lower feedback loop bandwidth. Accordingly, the circuit 200 is particularly useful in situations requiring a low jitter clock generated from an extremely high jitter magnitude clock input. That is, a low-jitter output clock with average frequency alignment to the input is generated even when an input signal has an extremely large input jitter magnitude. Neither continuous nor discretized gain is required from the error signal to the oscillator control, allowing for highly efficient low-area digital control.

Turning now to FIG. 3, a timing diagram shows waveforms of the two clocks and their corresponding pulse train signals used in the circuit of FIG. 2. That is, the pulse train generator 204 creates two pulse train signals including a pulse of a reference pulse train (REF Pulse Train) every D cycles of the input clock, and a pulse of a generated pulse train (OSC Pulse Train) every M cycles of the output clock. The generated pulse train provides a reference to enable phase detection between the input and output clock, a time reference for the update rate selector 214, and a relative phase reference for the average frequency aligning state machine 206. The functions of the various pulse signals will be described in reference to the remaining figures.

Figure 4:
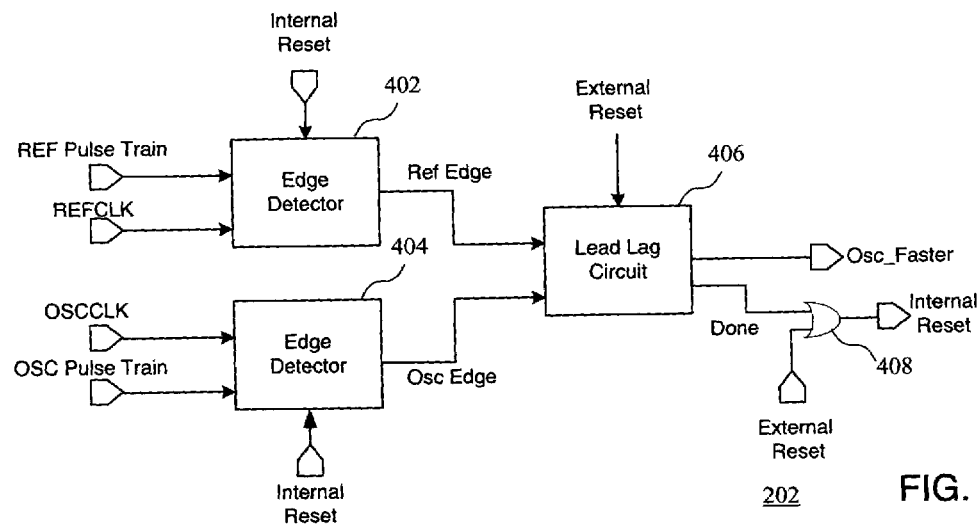
FIG. 4 is a block diagram of a phase detector employed in the circuit of FIG. 2.

Turning now to FIG. 4, a block diagram of a phase detector employed in FIG. 2 is shown. The phase detector of FIG. 4 comprises a level mode phase detector that generates a binary output signal identifying the direction OSCCLK frequency has to change to reach the desired frequency. The correct output is maintained even when the phase difference is greater than 360 degrees, and as high as $M \times T_{oscclk}$, where $T_{oscclk}$ is the period of the generated clock signal OSCCLK. Accordingly, the phase detector enables a freq-aligned mode of operation. As will be described in reference to FIGS. 6–9, the waveform behavior of the phase detector's error signal can align to an offset from the REFCLK phase equal to an integer multiple of M multiplied by OSCCLK period (i.e. $2*M*T_{OSCCLK}$, $3*M*T_{OSCCLK}$, $4*M*T_{OSCCLK}$, etc.). Aligning to one of these M determined offsets in phase will be referred to as aligning/locking to a different phase line.

Referring specifically to FIG. 4, the phase detector 202 includes edge detector 402 for the reference pulse train and edge detector 404 for the generated pulse train, and a lead-lag state machine 406. Phase detector 202 is responsive to clock signal REFCLK, clock signal OSCCLK, a concurrence signal REF Pulse Train, and a concurrence signal OSC Pulse Train. Phase detector 202 generates a control signal OSC_Faster. When clock signal OSC_CLK is leading clock signal REF_CLK, an active control signal OSC_Faster is generated. Conversely, when clock signal OSC_CLK is lagging clock signal REF_CLK, an inactive control signal OSC_Faster is generated. Control signal OSC_Faster may be used to guide oscillator 212 to produce clock signal OSCCLK having a frequency and phase such that clock signals OSCCLK and REFCLK are synchronized. Concurrence signals OSC Pulse Train and REF Pulse Train act as gate signals to control the timing of phase comparisons between clock signals REFCLK and OSCCLK, as described in more detail below.

In particular, edge detector 402 is responsive to clock signal REFCLK and concurrence signal REF Pulse Train. Similarly, edge detector 404 is responsive to clock signal OSCCLK and concurrence signal OSC Pulse Train. Edge detector 402 generates an edge detection signal REF_EDGE, and edge detector 404 generates an edge detection signal OSC_EDGE. When concurrence signal REF_EDGE is in an active state, edge detector 402 drives edge detection signal REF_EDGE to the active state when the next edge of clock signal REF_CLK arrives. When concurrence signal OSC_EDGE is in the active state, edge detector 404 drives edge detection signal OSC_EDGE to the active state when the next edge of OSC_CLK arrives. Edge detectors 402 and 404 could be configured to detect positive edges of the clock signals or negative edges of the clock signals.

Edge detectors 402 and 404 could be asynchronous level-mode sequential circuits, for example, and asynchronously detect the next edge of their respective clock signals when their respective concurrence signals are in the active state. Thus, a level-change in a clock signal and/or a concurrence signal will cause a change in state of the edge detection signal and/or one or more internal signals in a given edge detector. A Lead-lag state machine 406 is responsive to edge detection signals REF_EDGE and OSC_EDGE. Lead-lag state machine 406 preferably incorporates asynchronous level-mode sequential circuitry in order to determine which of clock signals REFCLK and OSCCLK is leading. If an edge of clock signal OSCCLK is detected first, lead-lag state machine 406 drives control signal OSC_Faster to the active state. If an edge of input signal REFCLK is detected, lead-lag state machine 406 drives control signal OSC_faster to the inactive state.

After each phase comparison, lead-lag state machine 406 drives a reset signal INTERNAL_RESET to an active state. Reset signal INTERNAL_RESET is coupled to edge detectors 402 and 404 in order to reset edge detection signals REF_EDGE and OSC_EDGE, respectively, to an inactive state. As will be described in more detail in reference to FIG. 6, the internal reset enables the phase detector to maintain frequency alignment to a phase line. In one embodiment, an external reset signal is coupled to lead-lag state machine 406. If the external reset signal is used, reset signal INTERNAL_RESET is coupled to an OR gate 408 along with the external reset signal. If either reset signal INTERNAL_RESET or the external reset signal is in the active state, the edge detectors will be reset. Operation of the phase detector 202 is described in more detail U.S. Pat. No. 6,756,822, the entire patent of which is incorporated herein by reference.

Figure 5:
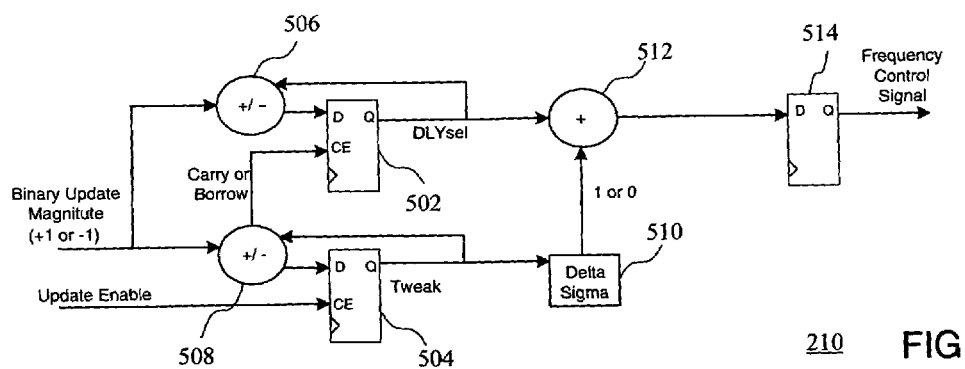
FIG. 5 is a block diagram of digital frequency register according to an embodiment of the present invention.

Turning now to FIG. 5, a circuit diagram of digital frequency register according to an embodiment of the present invention is shown. The digital frequency register 210, which holds the digital representation of the controllable oscillator 212 period, comprises an oscillator control circuit having a delay select register 502 and a tweak register 504. The update enable signal is a clock enable for the tweak register 504, and the update magnitude is an addition or subtraction (+1 or −1) depending on the input error signal. The delay select register and tweak register receives the Force_Up or Force_Down signal at a adder/subtractor circuit, 506 and 508 respectively. An output of the tweak register is also coupled to the adder/subtractor circuit 508, and a delta sigma circuit 510. The output of the tweak register could be the least significant bits of the clock period selection signal. Finally, an adder 512 adds the output of the delay select register signal and the output of the delta sigma circuit, and couples the sum to a register 514 which generates the frequency control signal. Accordingly, the tweak register provides the least significant bits of the frequency control signal, where the frequency control signal comprises a DLYsel portion provided by the delay select register and a fractional portion provided by the tweak register.

Figure 6:
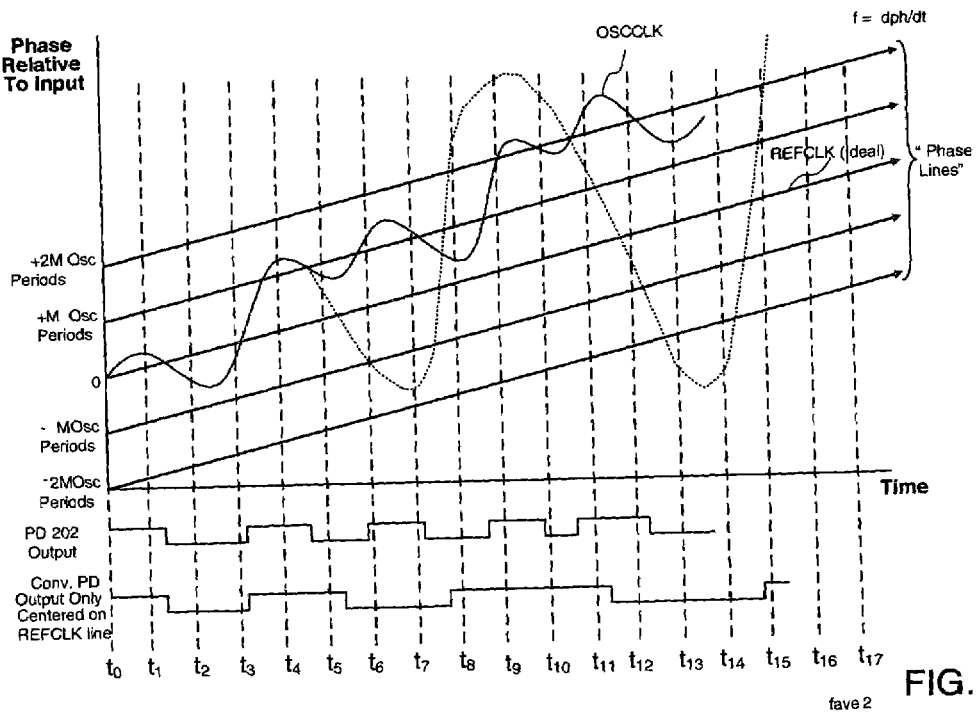
FIG. 6 is a timing diagram showing the phase drift of a signal locking to different phase lines which are offset from an ideal phase line of a reference clock.

Turning now to FIG. 6, a timing diagram shows the phase drift of a signal locking to different phase lines which are offset from an ideal phase line of a reference clock. The timing diagram of FIG. 6 plots the phase relative to an ideal phase of a reference clock on the vertical axis and time on the horizontal axis. Accordingly, the instantaneous frequency is the slope of the line. The behavior of the phase detector 202 prevents the OSCCLK's relative phase (i.e. phase relative to the phase of the REFCLK) and frequency from going into a growing oscillation (as shown by the dashed line). Rather, the oscillation of the instantaneous frequency is dampened each time the system aligns to a new phase line. For example, the phase detector 202 of FIG. 2 as described above enables the phase detector to be internally reset so that the PLL can lock to an ideal phase line and the offset phase lines.

As can be seen in FIG. 6, each new phase line represents a gain or loss in phase of M OSCCLK cycles. Between $t_0$ and $t_3$, the frequency of the OSCCLK is maintained relative to a first pulse of reference clock, and is therefore locked to the ideal REFCLK phase line. As the frequency of the OSCCLK starts to drift, the phase detector will maintain the frequency of the oscillator clock relative to a second pulse of the reference clock which is out of phase by M oscillator clock periods. For example, between $t_4$ and $t_9$, the frequency of the OSCCLK is maintained relative to the second pulse of reference clock. As the frequency starts to drift again, the phase detector will maintain the frequency of the oscillator clock relative to a third pulse of the reference clock (which is out of phase by 2M oscillator clock periods) between $t_9$ and $t_{14}$. Accordingly, the phase detector will make the correct decision regardless of the phase difference. That is, the phase detector will direct the frequency to a phase line that maintains frequency alignment. As can be seen below the time reference coordinate line, the output of the phase detector 202 is compared to the output of a conventional phase detector centered on the ideal REFCLK line. The output phase detector 202 switches more frequently to prevent the oscillator from going into a growing oscillation.

Figure 7:
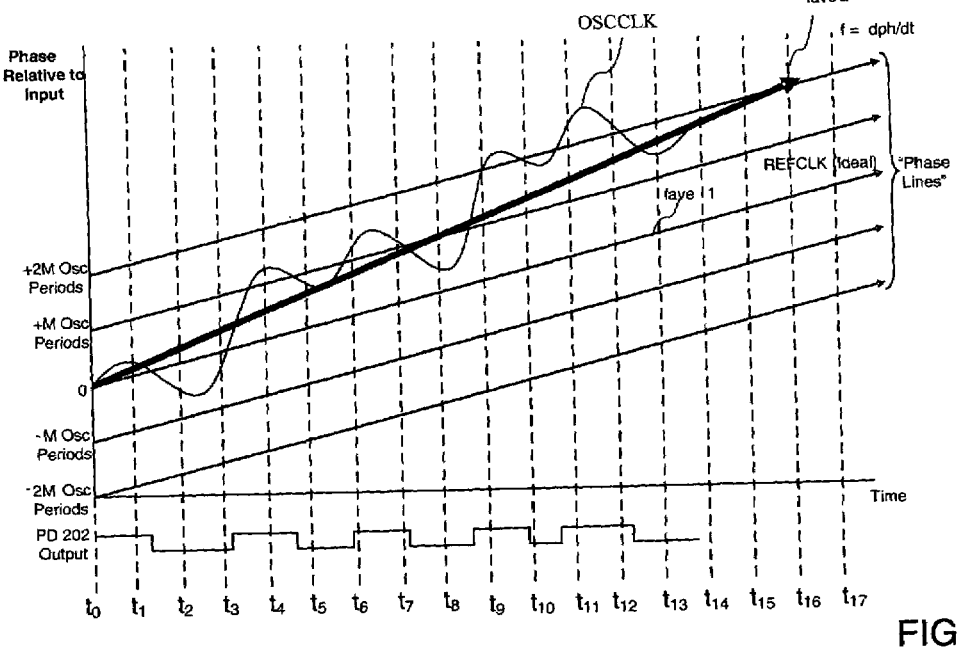
FIG. 7 is a timing diagram showing the average frequency drift of the oscillator clock signal of FIG. 6.

The average frequency drift of the oscillator clock is shown in the timing diagram FIG. 7. The phase detector circuit of FIG. 2 comprises a phase detector which maintains a tight band of instantaneous frequencies by dampening the oscillation. The oscillator circuit will have low output jitter because the range of slope (i.e. output frequencies) is minimal when the system aligns to different phase lines. By realigning on new phase lines, the clock generation feedback loop remains stable with only a binary error signal and without needing gain in the feedback loop. However, jumping phase lines in one direction will cause an overall frequency drift. That is, the average slope of the system diverges from the average slope of the ideal REFCLK frequency, which could cause long term loss of cycles relative to the REFCLK without proper control. According to another aspect of the invention which will be described in more detail in reference to FIGS. 8 and 9, a state machine prevents the oscillator from continuing to jump phase lines, and forces the average frequency of the oscillator to align to an ideal phase of the reference clock signal.

Figure 8:
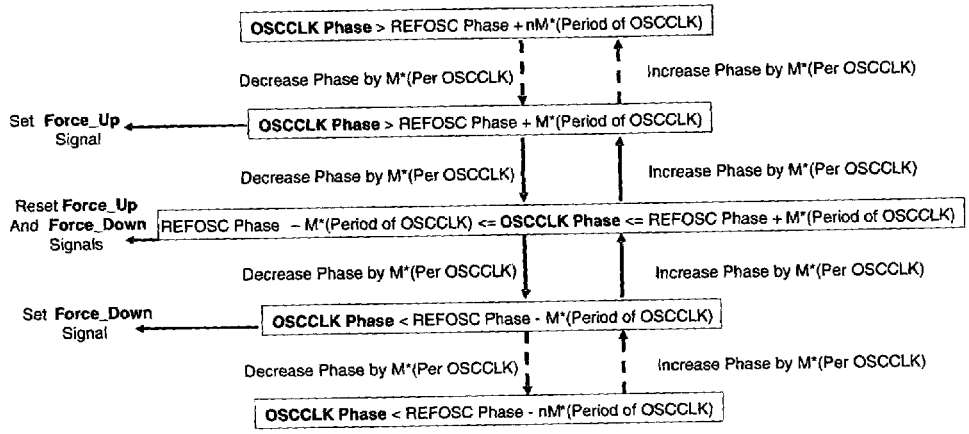
FIG. 8 is a state diagram showing the operation of an average frequency alignment state machine according to an embodiment of the present invention.
Figure 9:
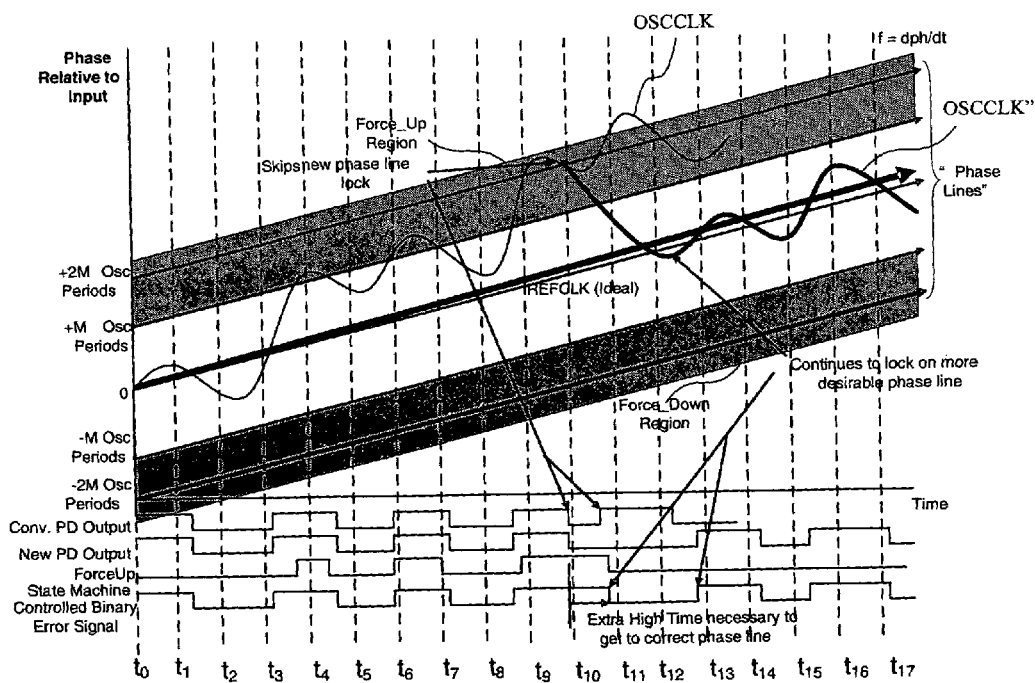
FIG. 9 is a timing diagram showing an oscillator signal having an average frequency aligned to an ideal phase line of a reference clock according to an embodiment of the present invention.

Turning now to FIG. 8, a state diagram shows the operation of the average frequency alignment state machine according to an embodiment of the present invention. An example of the operation of the circuit of FIG. 2 employing the average frequency alignment state machine is also described in reference to FIG. 9. As will be described in more detail below, the states of the state machine correspond with the OSCCLK phase being in certain shaded regions of the timing diagram of FIG. 9. Having a larger number of states allows the state machine to track the ideal center state and phase match with REFOSC in the midst of high input jitter that can cause large phase deviations and jumping of several phase lines.

For example, when the phase of the OSCCLK (OSCCLK phase) is within an offset period M*Period of OSCCLK of the phase of the REFCLK (REFOSC phase), the Force_Up and Force_Down signals are reset. This can be seen for example between $t_0$ and $t_3$ of FIG. 9. As is also shown between $t_0$ and $t_3$, the output of the phase detector 202 is high when the OSCCLK signal is above the REFCLK (ideal) phase line, and is low when the OSCCLK signal is below the REFCLK (ideal) phase line. Between $t_3$ and $t_4$, as the phase of the OSCCLK signal passes the ideal REFCLK+M Osc period phase line, the OSCCLK signal is in the Force_Up region (shaded) and the Force_Up signal is active (i.e. high). The Force_Up signal is coupled to the selector 208 of FIG. 2 to manually select an input of the selector circuit (i.e. output a signal other than the output of the phase detector) to control the oscillator. As can be seen, the Force_Up signal then generally tracks the OSCCLK signal as it oscillates above and below the REFCLK+M Osc period phase line between $t_4$ and $t_9$.

Between $t_9$ and $t_{10}$, when the OSCCLK signal is in the Force_Up region and oscillates above the REFCLK+2M Osc period phase line (in this example n=2 in FIG. 8), the Force_Up signal is high, and stays high even after $t_{10}$ (when the output of the phase detector goes low because the OSCCLK signal is locking to the REFCLK+2M Osc period phase line). Therefore, the Force_Up signal remains high to force the OSCCLK signal to lock to the ideal REFCLK phase line (as shown by the OSCCLK" signal). That is, the Force_Up signal overrides the output of the phase detector to adjust the frequency control signal and force the OSCLK signal to lock to the ideal reference phase line. Accordingly, the average frequency alignment state machine causes the OSCCLK signal to frequency align to the ideal REFCLK phase to prevent the OSCCLK signal from continuing to jump phase lines. As can be seen, the frequency aligning state machine allows the phase detector to use at least two separate phase lines, other than the ideal phase line, to ensure that the stability is maintained. The state machine overrides the frequency drift characteristics of an unchecked phase detector output signal but simultaneously gives the phase detector the ability to dampen possibly growing oscillations.

Figure 10:
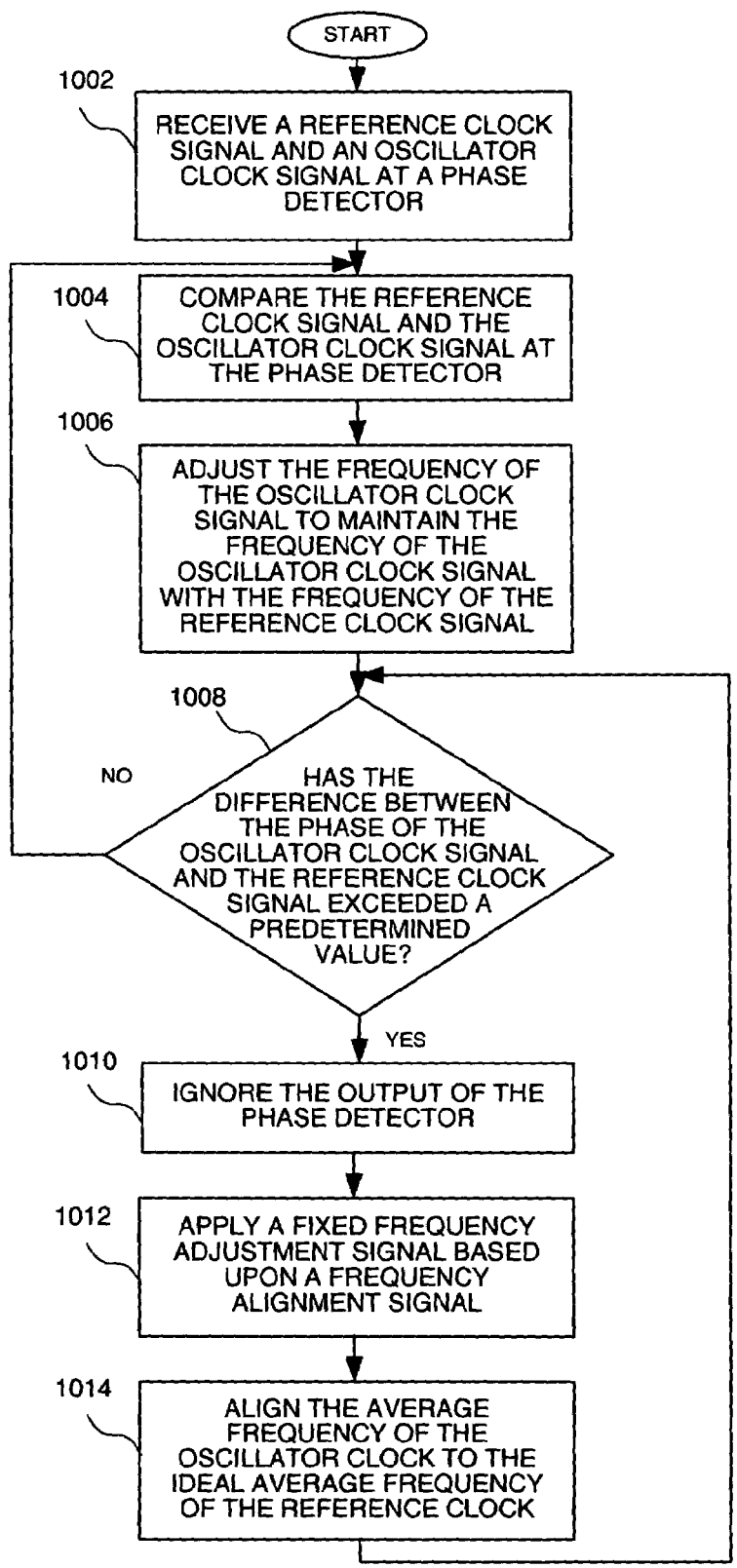
FIG. 10 is a flow chart showing a method of generating an oscillator signal according to an embodiment of the present invention.

Turning now to FIG. 10, a flow chart shows a method of generating a clock signal according to an embodiment of the present invention. The method of FIG. 10 could be implemented using the circuit of FIG. 2, or some other suitable circuit. A reference clock signal and an oscillator clock signal are received at a phase detector at a step 1002. The reference clock signal and the oscillator clock signal are compared at the phase detector at a step 1004. The frequency of the oscillator clock signal is adjusted to maintain the frequency of the oscillator clock signal with the frequency of the reference clock signal at a step 1006. It is then determined whether the phase difference between the oscillator clock signal and the reference clock signal has exceeded a predetermined value at a step 1008. If so, the output of the phase detector is ignored at a step 1010. A fixed frequency adjustment signal based upon a frequency alignment signal is applied to the oscillator at a step 1012. Finally, the average frequency of the oscillator clock signal is aligned to an ideal average frequency signal of the reference clock at a step 1014.

In summary, the error signal generation of the phase detector and the method of processing this signal by the average frequency aligning state machine allow long-term frequency stability by monitoring the possible short-term frequency instability. The average frequency alignment state machine controls the short-term frequency oscillation and locks on new phase lines to maintain average frequency alignment. When the OSCCLK phase has drifted greater than a predetermined number of OSCCLK periods from the ideal phase (i.e. into one of the shaded regions of FIG. 9 for example), either a Force_Up or Force_Down signal is generated to ensure the frequency is adjusted to return towards the average frequency of the ideal REFCLK phase. The signal is preferably a binary signal that overrides the phase detector output. Accordingly, average frequency alignment is maintained because the overall OSCCLK slope is maintained parallel to the REFOSC slope. The state machine preferably allows more than one phase line for alignment because the oscillation dampening, low-jitter affect of the phase detector still remains as it jumps from different phase lines. However, because the phase line jumps are bounded, the average frequency alignment state machine ensures that continuous drift will not occur in one direction.

It can therefore be appreciated that the new and novel circuit and method and system for generating an oscillator clock signal has been described. It will be appreciated by those skilled in the art that, given the teaching herein, numerous alternatives and equivalents will be seen to exist which incorporate the disclosed invention. As a result, the invention is not to be limited by the foregoing embodiments, but only by the following claims.

The invention claimed is:

1. A circuit for generating a clock signal which is frequency aligned with a reference clock signal, said circuit comprising:
   a controllable oscillator outputting said generated clock signal;
   a phase detector coupled to receive said reference clock signal and said generated clock signal;
   a frequency alignment circuit coupled to receive a reference pulse train based upon said reference clock signal and a generated pulse train based upon said generated clock signal, said frequency alignment circuit generating an average frequency alignment signal based upon a comparison of the phase of said generated pulse train and a selected phase of said reference pulse train comprising one of a first pulse of the reference clock signal and a second pulse of the reference clock signal which is out of phase by predetermined number of periods of the generated clock signal; and
   an oscillator control circuit selectively coupled to receive an output of said phase detector based upon said average frequency alignment signal, said oscillator control circuit generating an oscillator control signal for controlling the frequency of said generated clock signal.

2. The circuit of claim 1 further comprising a selection circuit coupled to said frequency alignment circuit and said phase detector, said selection circuit coupling a frequency update signal to said oscillator control circuit in response to said average frequency alignment signal.

3. The circuit of claim 2 wherein said selection circuit comprises a multiplexer coupled to receive the output of said phase detector and a control signal comprising said average frequency alignment signal and wherein said multiplexer selects one of the output of the phase detector, a frequency increase signal and a frequency decrease signal in response to said average frequency alignment signal.

4. The circuit of claim 3 wherein said frequency alignment circuit comprises a finite state machine.

5. The circuit of claim 2 further comprising a pulse train generator coupled to receive said reference clock signal and said generated clock signal, said pulse train generator outputting said reference pulse train and said generated pulse train.

6. The circuit of claim 5 wherein said phase detector is coupled to receive said reference pulse train and said generated pulse train from said pulse train generator.

7. The circuit of claim 5 further comprising an update rate selector coupled to said pulse train generator, said update rate selector outputting an update enable signal to said oscillator control circuit based upon an update rate signal input to said update rate selector.

8. The circuit of claim 7 wherein said oscillator control circuit is further coupled to receive said frequency update signal in response to said update enable signal and wherein said oscillator control circuit comprises a digital frequency register.

9. The circuit of claim 1 wherein said reference pulse train comprises a pulse for a predetermined number of reference clock pulses and said generated pulse train comprises a pulse for a predetermined number of generated clock pulses.

10. The circuit of claim 1 wherein said controllable oscillator comprises a digitally controlled oscillator.

11. A circuit for generating a clock signal which is frequency aligned with a reference clock signal, said circuit comprising:
  means for generating said clock signal;
  phase detector means for comparing said reference clock signal and said generated clock signal;
  frequency alignment means for receiving a reference pulse train based upon said reference clock signal and a generated pulse train based upon said generated clock signal and generating an average frequency alignment signal based upon a comparison of the phases of said generated pulse train and said reference pulse train;
  oscillator control means for controlling the frequency of said generated clock signal, said oscillator control means being selectively coupled to receive an output of said phase detector means based upon said average frequency alignment signal; and
  update rate selector means for coupling an update enable signal to said oscillator control means.

12. The circuit of claim 11 further comprising pulse generator means for generating said reference pulse train and said generated pulse train.

13. The circuit of claim 11 further comprising selector means for selecting one of the output of the phase detector means, a frequency increase signal and a frequency decrease signal in response to said average frequency alignment signal from said frequency alignment means.

14. A method of generating a clock signal which is frequency aligned with a reference clock signal, said method comprising:
  receiving said reference clock signal and a generated clock signal at a phase detector;
  comparing said reference clock signal and said generated clock signal at said phase detector;
  adjusting the frequency of said generated clock signal to maintain the frequency of the generated clock signal with the frequency of said reference clock signal by adjusting the frequency of said generated clock signal to be in phase with a first pulse of said reference clock signal or a second pulse of said reference clock signal offset by a multiple of the oscillator clock period;
  determining when the phase difference between said generated clock signal and said reference clock has exceeded a predetermined value;
  aligning an average frequency signal of said generated clock to a frequency signal of said reference clock and coupling to receive said reference clock signal and said generated clock signal and outputting a reference pulse train and a generated pulse train.

15. The method of claim 14 wherein said step of comparing said reference clock signal and said generated clock signal at said phase detector comprises a step of comparing the reference pulse train based upon said reference clock signal and the generated pulse train based upon said generated clock signal.

16. The method of claim 15 wherein said step of adjusting the frequency of said generated clock signal comprises a step of adjusting the frequency of said generated clock signal based upon an output of said phase detector.

17. The method of claim 14 wherein said step of determining when the phase difference between said generated clock signal and said reference clock signal has exceeded a predetermined value comprises a step of comparing a reference pulse train based upon said reference clock signal and a generated pulse train based upon said generated clock signal.

18. The method of claim 14 wherein said step of aligning an average frequency signal of said generated clock signal to a frequency signal of said reference clock comprises a step of overriding an output of said phase detector with a fixed frequency adjustment signal.

* * * * *